United States Patent
Ofoma et al.

(10) Patent No.: US 9,067,287 B2
(45) Date of Patent: Jun. 30, 2015

(54) METHOD OF MANUFACTURING A HEAT TRANSFER SYSTEM FOR AIRCRAFT STRUCTURES

(75) Inventors: Uchenna Ofoma, San Gabriel, CA (US); Bart Dean Hibbs, Simi Valley, CA (US); Ronald Olch, Van Nuys, CA (US); Justin B. McAllister, Simi Valley, CA (US)

(73) Assignee: AEROVIRONMENT, INC., Monrovia, CA (US)

( * ) Notice: Subject to any disclaimer, the term of this patent is extended or adjusted under 35 U.S.C. 154(b) by 766 days.

(21) Appl. No.: 13/220,343

(22) Filed: Aug. 29, 2011

(65) Prior Publication Data

US 2013/0047435 A1    Feb. 28, 2013

(51) Int. Cl.
*B23P 15/26* (2006.01)
*F28D 9/00* (2006.01)
*F28F 3/02* (2006.01)
*H05K 7/20* (2006.01)
(Continued)

(52) U.S. Cl.
CPC .......... *B23P 15/26* (2013.01); *B32B 9/005* (2013.01); *B32B 9/007* (2013.01); *B32B 37/142* (2013.01); *B32B 2307/302* (2013.01); *B32B 5/18* (2013.01); *B32B 33/00* (2013.01); *B32B 2605/18* (2013.01); *B64D 13/006* (2013.01); *F28D 9/0025* (2013.01); *F28D 9/0081* (2013.01); *F28F 3/005* (2013.01); *F28F 3/027* (2013.01); *F28F 21/02* (2013.01); *F28F 2245/04* (2013.01); *Y10T 29/4935* (2015.01); *B64D 2013/0614* (2013.01); *H05K 7/20509* (2013.01); *H01L 23/34* (2013.01); *H01L 23/467* (2013.01); *H01L 2924/0002* (2013.01)

(58) Field of Classification Search
CPC .......... B21D 13/00; B32B 5/20; B32B 9/005; B32B 37/142; B32B 37/146; B32B 2307/302; B32B 9/007; B64D 13/006; F28D 9/0025; F28D 9/0081; F28F 3/005; F28F 3/027; F28F 21/02; F28F 2245/04; B23P 15/26
USPC .............................. 29/890.039, 890.04, 530
See application file for complete search history.

(56) References Cited

U.S. PATENT DOCUMENTS

| | | |
|---|---|---|
| 2006/0035069 A1 | 2/2006 | Hanai |
| 2007/0041160 A1 | 2/2007 | Kehret et al. |

(Continued)

FOREIGN PATENT DOCUMENTS

EP    0537965 A2    4/1993

OTHER PUBLICATIONS

PCT/US2012/051499.

*Primary Examiner* — Alexander P Taousakis
*Assistant Examiner* — Matthew P Travers
(74) *Attorney, Agent, or Firm* — Brinks Gilson & Lione; Eric Aagaard

(57) ABSTRACT

A method of manufacturing a heat transfer system is provided that includes, in one form, preparing a heat conducting array by perforating at least a portion of the heat conducting array, placing the heat conducting array around foam elements, placing a heat conducting spreader along one surface area of the foam elements, placing a lower skin over the heat conducting spreader, placing an upper skin over an opposite surface area of the foam elements to create a structural assembly, and curing the structural assembly. A material of the foam elements flows through the perforated portion of the heat conducting array during the curing step.

17 Claims, 12 Drawing Sheets

(51) Int. Cl.
*H01L 23/34* (2006.01)
*H01L 23/467* (2006.01)
*B32B 9/00* (2006.01)
*B32B 37/14* (2006.01)
*B32B 5/18* (2006.01)
*B32B 33/00* (2006.01)
*B64D 13/00* (2006.01)
*F28F 3/00* (2006.01)
*F28F 21/02* (2006.01)
*B64D 13/06* (2006.01)

(56) References Cited

U.S. PATENT DOCUMENTS

2008/0196869 A1 8/2008 Behrens et al.
2010/0031599 A1* 2/2010 Kennedy et al. ............. 52/583.1
2010/0326645 A1 12/2010 Fan et al.

* cited by examiner

METHOD OF MANUFACTURING A HEAT TRANSFER SYSTEM FOR AIRCRAFT STRUCTURES

FIELD

The present disclosure relates to avionics or equipment bays for aircraft, and in particular, method of manufacturing systems for managing heat to improve cooling of electronics within the bays.

BACKGROUND

The statements in this section merely provide background information related to the present disclosure and may not constitute prior art.

Most aircraft, or air vehicles, typically include a number of bays that house a variety of equipment, such as avionics, batteries, diagnostic equipment, and servicing ports, among others. These bays extend into the interior of the aircraft to define a cavity, and are covered by removable doors or access panels so that the aircraft can maintain a smooth outer moldline surface for aerodynamic performance.

During operation, certain components located within these equipment bays can reach high temperatures, which can cause premature failure, and thus a means to provide cooling to these components is often provided. Typical methods may include integrated fans or cooling ducts, in addition to vents or louvers that allow airflow to enter the equipment bays during flight. Some equipment bays, however, are required to be sealed from moisture intrusion during operations, which limits certain cooling options, such as the vents or louvers. Accordingly, sealed equipment bays that include heat generating components, such as electronic components on printed circuit boards, or batteries, present a challenge in providing the requisite cooling to prevent premature equipment failure.

SUMMARY

In one form of the present disclosure, a method of manufacturing a heat transfer system is provided that comprises preparing a heat conducting array by perforating at least a portion of the heat conducting array, placing the heat conducting array around foam elements, placing a heat conducting spreader along one surface area of the foam elements, placing a lower skin over the heat conducting spreader, placing an upper skin over an opposite surface area of the foam elements to create a structural assembly, and curing the structural assembly. A material of the foam elements flows through the perforated portion of the heat conducting array during the curing step.

In another form, a method of manufacturing a heat transfer system is provided that comprises preparing a heat conducting array by perforating at least a portion of the heat conducting array, the heat conducting array comprising a pyrolytic graphite sheet (PGS) material, placing the heat conducting array around foam elements, placing a heat conducting spreader along one surface area of the foam elements, the heat conducting spreader comprising a pyrolytic graphite sheet (PGS) material, placing a lower skin over the heat conducting spreader, placing an upper skin over an opposite surface area of the foam elements to create a structural assembly, and curing the structural assembly. A material of the foam elements flows through the perforated portion of the heat conducting array during the curing step.

In still another form, a method of manufacturing a heat transfer system is provided that comprises preparing a heat conducting array by perforating at least a portion of the heat conducting array, placing the heat conducting array around core elements, placing a lower skin over one surface area of the core elements, placing an upper skin over an opposite surface area of the core elements to create a structural assembly, and forming the structural assembly. A material of the core elements extends through the perforated portion of the heat conducting array during the forming step.

Further areas of applicability will become apparent from the description provided herein. It should be understood that the description and specific examples are intended for purposes of illustration only and are not intended to limit the scope of the present disclosure.

DRAWINGS

In order that the disclosure may be well understood, there will now be described various forms thereof, given by way of example, reference being made to the accompanying drawings, in which.

The drawings described herein are for illustration purposes only and are not intended to limit the scope of the present disclosure in any way.

DETAILED DESCRIPTION

The following description is merely exemplary in nature and is not intended to limit the present disclosure, application, or uses.

Figure 1:
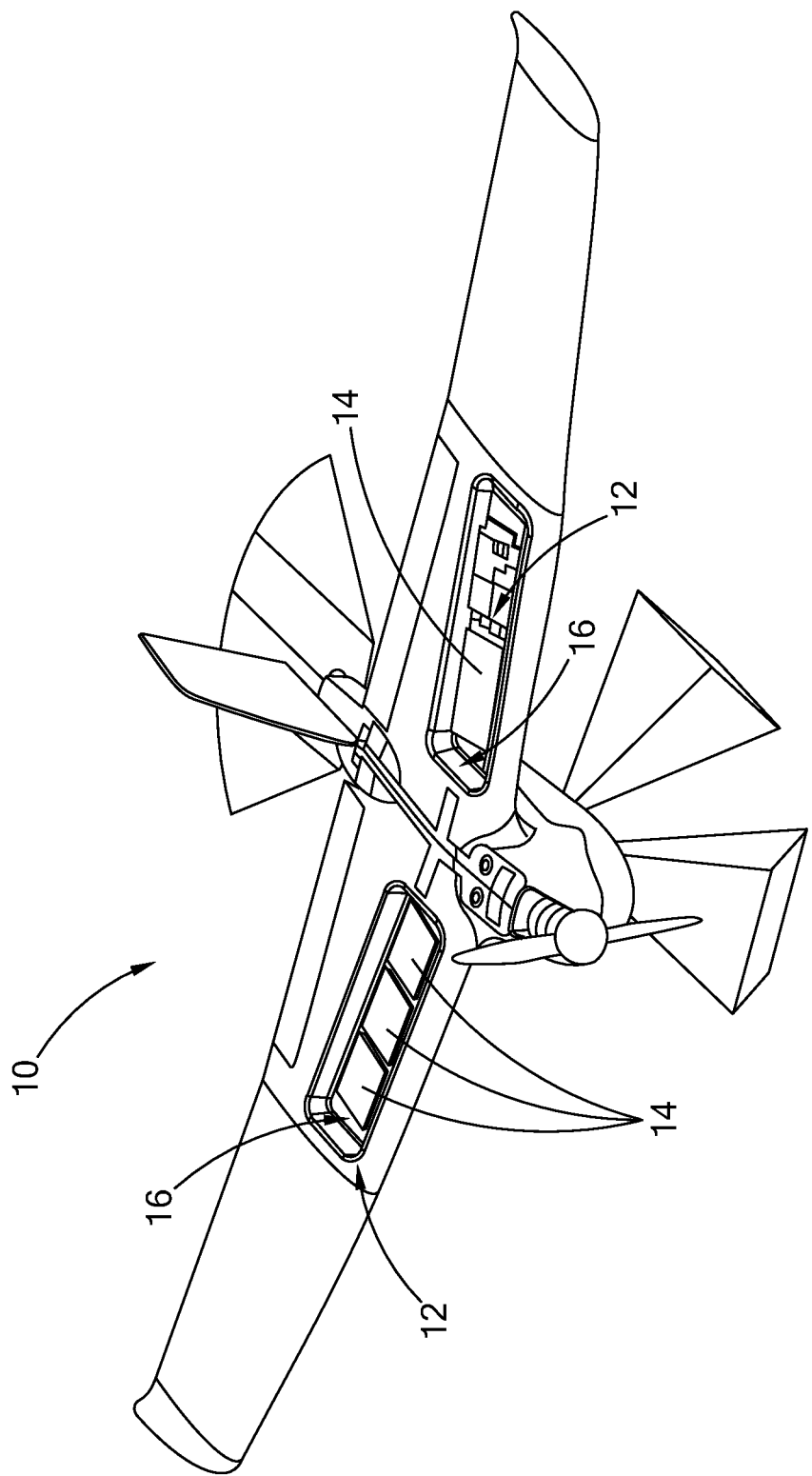
FIG. 1 is a perspective view of an exemplary air vehicle illustrating various equipment bays in which the principles of the present disclosure are applied.
Figure 2:
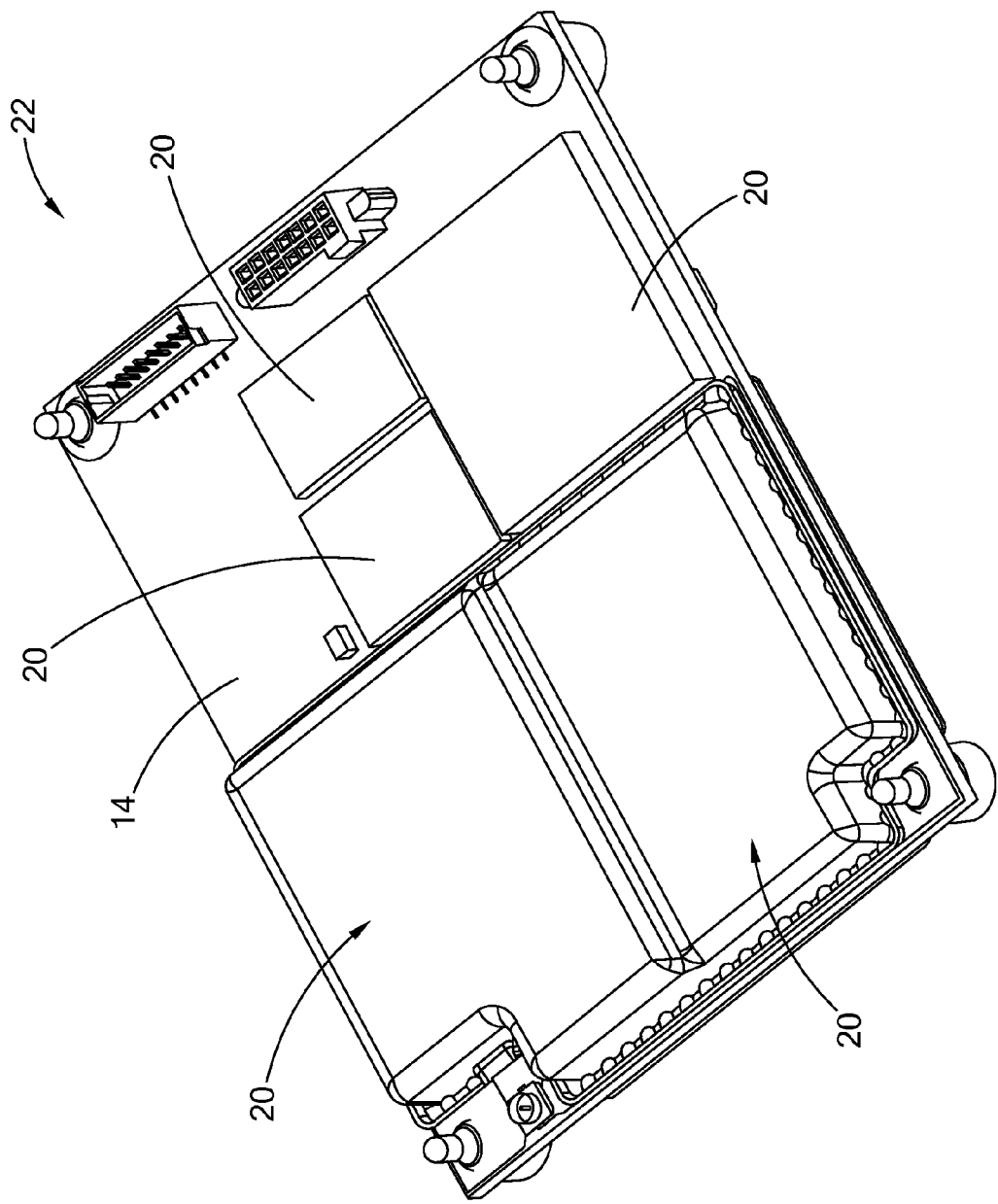
FIG. 2 is a top perspective view of one form of a system for managing heat transfer constructed in accordance with the principles of the present disclosure.

Referring to FIG. 1, an air vehicle is illustrated and generally indicated by reference numeral 10. The air vehicle 10 includes a number of equipment bays 12 that house a variety of equipment such as avionics or batteries, and in this particular illustration, a plurality of avionics boards 14 having electronic components that generate heat during operation. Additionally, some or all of the equipment bays 12 may be sealed in order to prevent moisture intrusion during operation, which is described in greater detail below.

The equipment bays 12 are covered by access panels, or hatches, which are not shown for purposes of clarity. The access panels cover the cavities 16 defined by the equipment bays 12 and generally conform to the outer moldline shape of the air vehicle 10, which in this illustrative example are upper wing moldlines. It should be understood that the air vehicle 10 and its configuration of equipment bays 12 is merely exemplary, and thus any number and/or size of equipment bays 12 may be employed in a variety of different types of air vehicles while remaining within the scope of the present disclosure.

Referring now to FIGS. 2 through 5, an exemplary avionics board 14 is illustrated and has at least one heat-generating component 20 disposed thereon, such as a radio frequency power amplifier. In one form, the avionics board 14 and heat-generating component(s) 20 are part of a system 22 for managing heat transfer according to the principles of the present disclosure that is better illustrated in FIG. 5. As shown, the system 22 includes the avionics board 14 and heat-generating components 20 within the cavity 16, which defines an inner wall portion 24. A plurality of heat conducting members 30 are disposed adjacent one another as shown (and also in FIGS. 3 and 4), which are positioned between the heat generating components 20 and the inner wall portion 24 of the cavity 16. The plurality of heat conducting members 30 generally comprise a core 32 and an outer shell 34 wrapped around at least a portion of the core 32. The outer shell 34 comprises a material having a relatively high thermal conductivity, and in one form is at least one sheet of pyrolytic graphite sheet (PGS) material. The cores 32 are thermally conductive, and in one form are a thermally conductive foam. Furthermore, the cores 32 are resilient in one form of the present disclosure, such that the heat conducting members 30 are more capable of withstanding impact loads. As used herein, the term "resilient" should be construed to mean having properties that allow the cores 32 to elastically or plastically deform under load. Additional details of the heat conducting members 30 and variants thereof are set forth in greater detail below.

Figure 3:
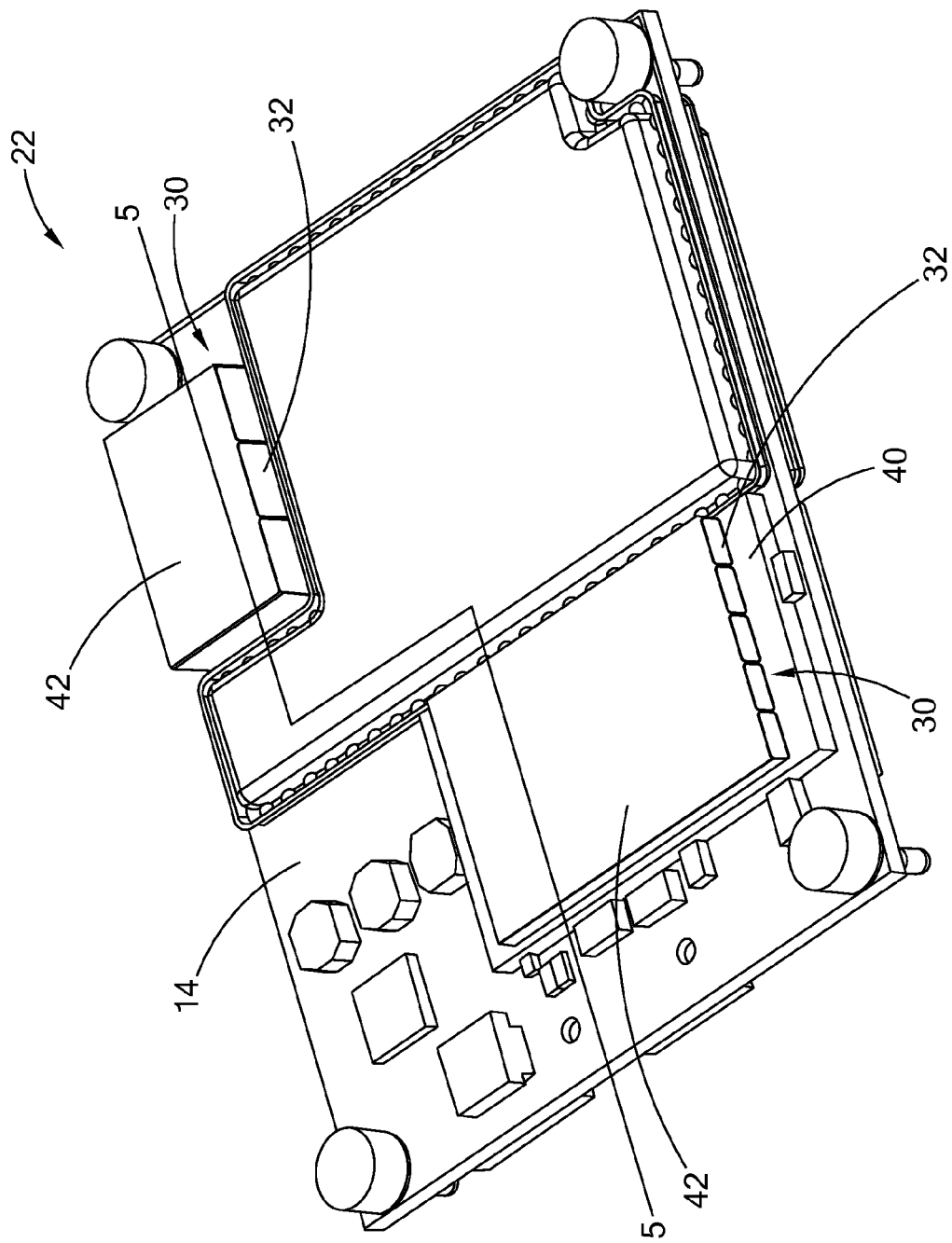
FIG. 3 is a bottom perspective view of the system for managing heat transfer in accordance with the principles of the present disclosure.
Figure 4:
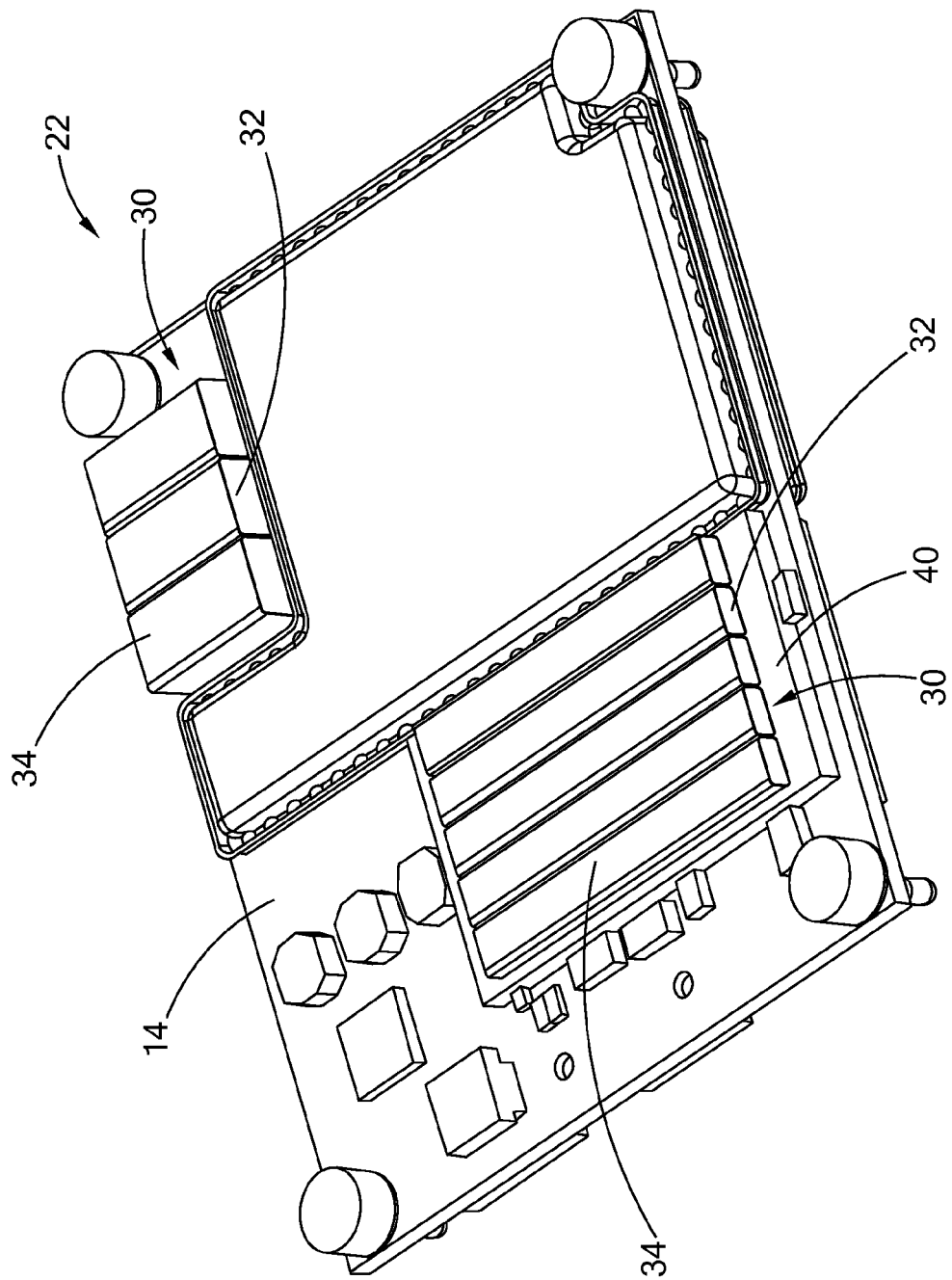
FIG. 4 is another bottom perspective view, with certain components removed for purposes of clarity, of the system for managing heat transfer in accordance with the principles of the present disclosure.
Figure 5:
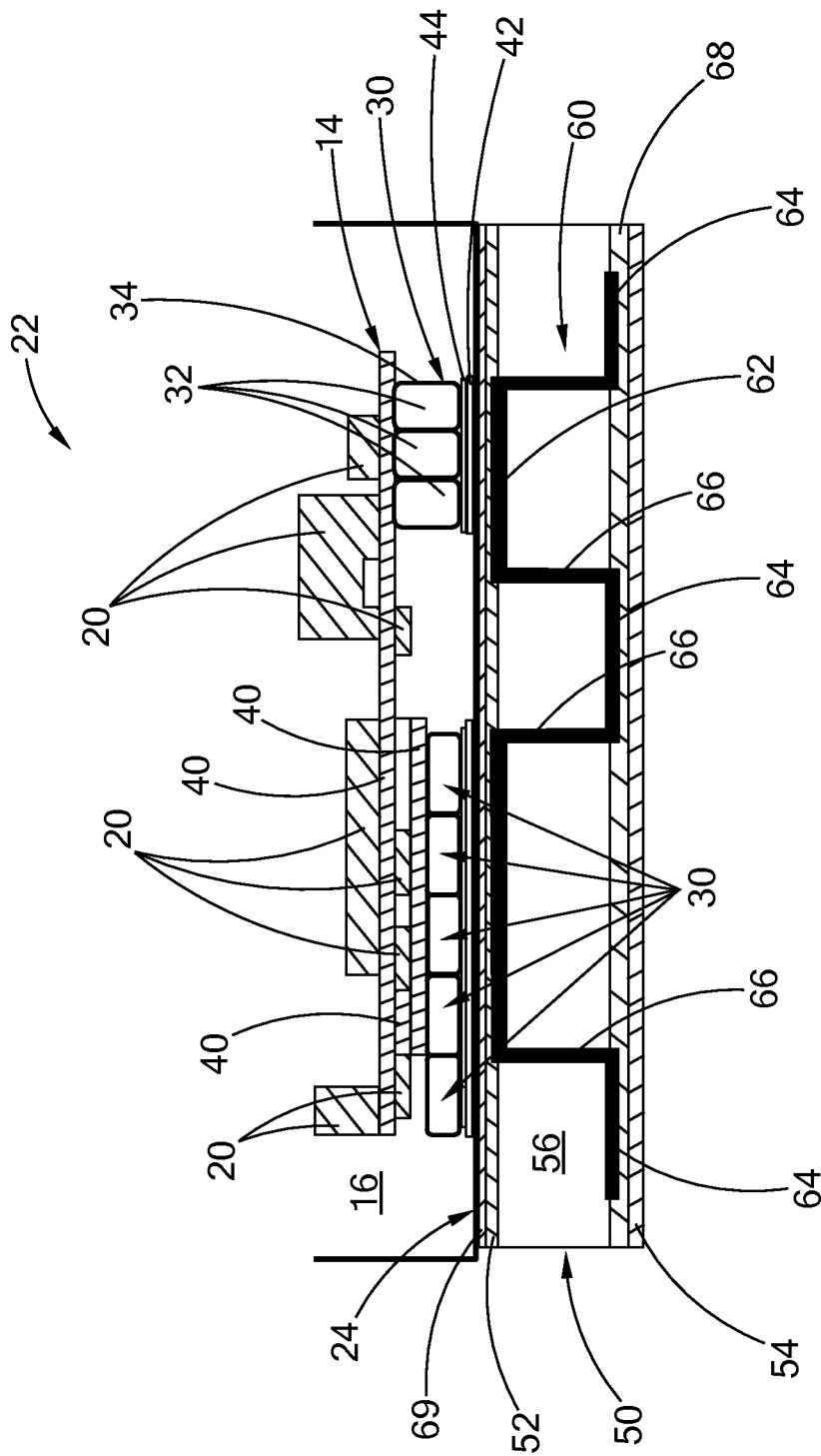
FIG. 5 is an offset cross-sectional view, taken along line 5-5 of FIG. 3, illustrating various components of the system for managing heat transfer in accordance with the principles of the present disclosure.

As further shown in FIG. 5, the system 22 also comprises at least one thermally conductive element 40 disposed between the heat conducting members 30 and the heat generating components 20. In one form, the thermally conductive elements 40 are thermal gap filler pads that have a thermal conductivity of about 5 W/mK. The system 22 also includes a pressure-sensitive adhesive (PSA) layer 42 in contact with the inner wall portion 24 to secure the heat conducting members 30 to the cavity 16. (The PSA layer 42 is also shown in FIG. 3). Alternately, a layer of stiffening material 44 may be disposed over the heat conducting members 30 and next to the PSA layer 42 in order to provide additional stiffness to the plurality of heat conducting members 30. In one form, this stiffening material 44 is a copper material, however, it should be understood that other materials that exhibit both thermal conductivity and an appropriate stiffness may also be employed while remaining within the scope of the present disclosure.

The system 22 also includes a structural member 50 disposed proximate the inner wall portion 24 of the cavity 16, which in this form comprises an upper skin 52, a lower skin 54, and a foam core 56 disposed between the upper skin 52 and the lower skin 54. As shown, at least one heat conducting array 60 extends through the foam core 56 and between the upper skin 52 and the lower skin 54. The heat conducting array 60 is also, in one form, a pyrolytic graphite sheet (PGS) material. The heat conducting array 60, in this form, includes at least one upper cap 62, at least one lower cap 64, and a wall portion 66 extending between the upper cap 62 and the lower cap 64. The caps 62 and 64 may also be understood as flanges or legs that extend away from or between the wall portions 66 as illustrated herein. As shown, the upper caps 62 are disposed proximate a heat source, which in this illustration is the heat-generating components 20 and the elements therebetween. Further details of the heat conducting array 60, and variants thereof, are set forth in greater detail below.

As further shown, an optional heat conducting spreader 68 is disposed between the lower caps 64 of the heat conducting array 60 and the lower skin 54 of the structural member 50, in one form of the present disclosure. Similar to forms of the heat conducting member 30 and the heat conducting array 60, the heat conducting spreader 68 is also a pyrolytic graphite sheet (PGS) material in one form of the present disclosure.

In an alternate form, a moisture-proof layer 69 is disposed over the upper skin 52 in an application where the cavity 16 is to be sealed from moisture intrusion. In this form, the moisture-proof layer 69 is an ethylene-co-methacrylic acid (EMAA) material, although it should be understood that other moisture-proof materials may be employed while remaining within the scope of the present disclosure.

Figure 6:
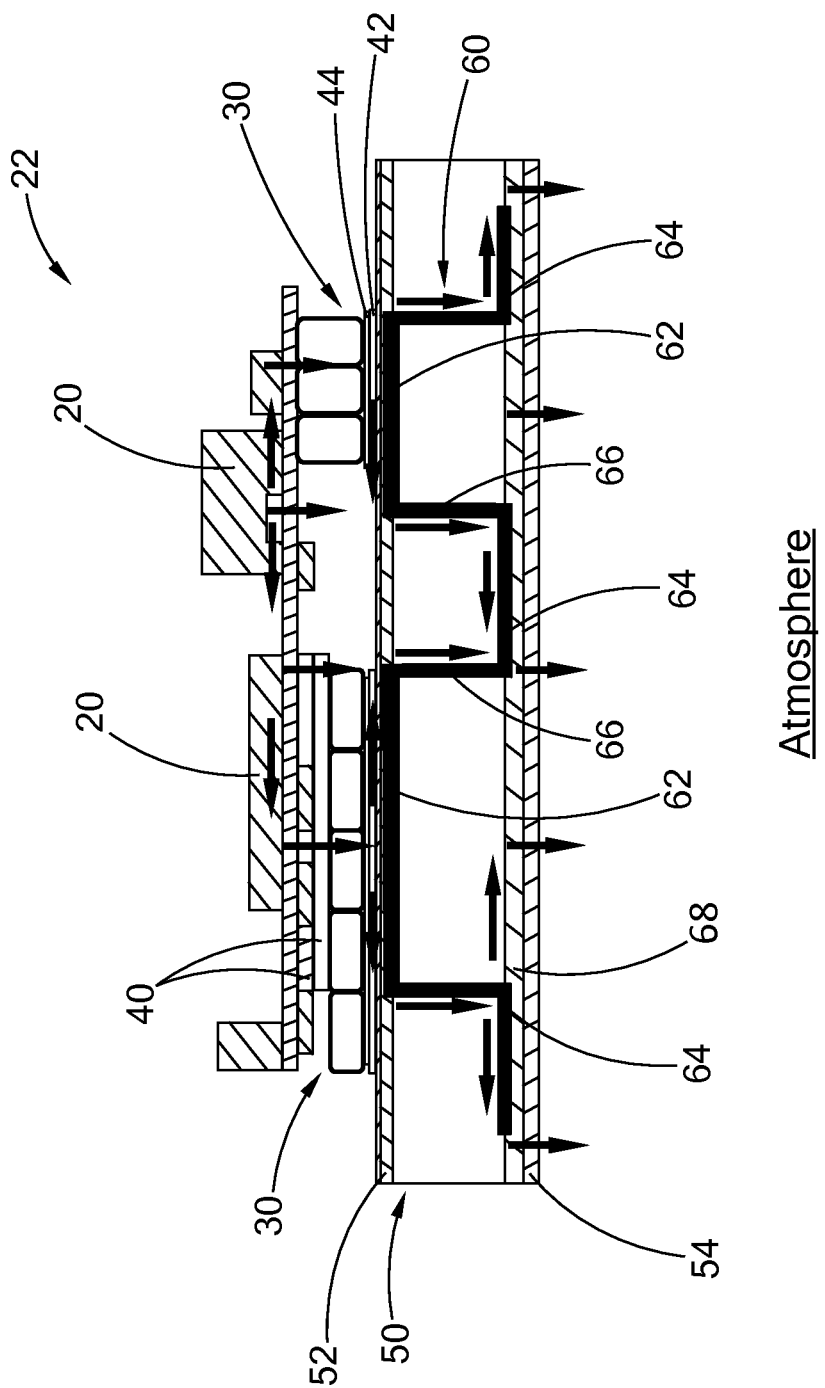
FIG. 6 is the offset cross-sectional view of FIG. 5 illustrating heat flow through the various components, including the heat conducting members, according to the principles of the present disclosure.

Referring now to FIG. 6, the system 22 and its heat transfer characteristics are illustrated and described in greater detail. As indicated by the arrows, in operation, heat that is generated from the components 20 is transferred to the heat conducting members 30 and the thermally conductive elements 40. The heat is then transferred through the PSA layer 42 (and also the stiffening material 44 if present), to the upper skin 52 of the structural member 50. From there, the heat transfers through the upper caps 62 of the heat conducting array 60, then down through the wall portions 66, to the lower caps 64, to the heat conducting spreader 68, and then out to the atmosphere through the lower skin 54. Accordingly, the system 22 provides efficient and effective heat transfer paths in order to dissipate the heat generated by components 20. In preliminary testing, the temperature difference between the heat generating components 20 and the lower skin 54 was reduced by about fourteen percent (14%). In other words, about fourteen percent (14%) of the heat generated by the components 20 did not reach the lower skin 54.

Figure 7:
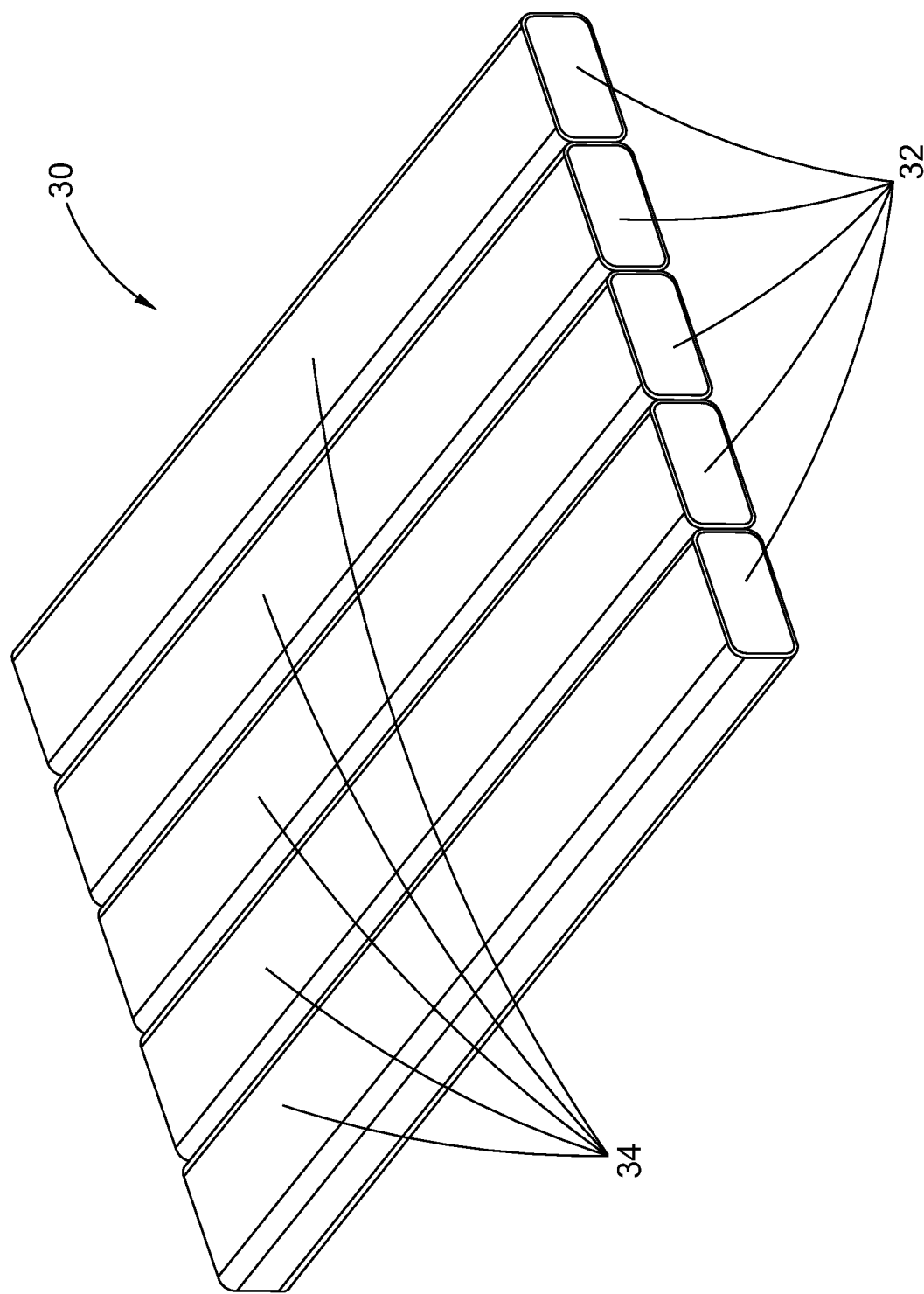
FIG. 7 is a perspective view of a plurality of heat conducting members constructed in accordance with the principles of the present disclosure.

Further details of the heat conducting members 30 are now described with reference to FIGS. 7 and 8. As previously set forth, the heat conducting members 30 include a core 32 and an outer shell 34 wrapped around at least a portion of the core 32. The outer shells 34 of the heat conducting members 30 are in physical contact with each other as shown in FIG. 7 in order to provide improved heat transfer characteristics. In this form, the heat conducting members 30 have a generally rectangular configuration as illustrated. It should be understood that other geometric configurations for the heat conducting members 30, one of which is set forth in greater detail below, are to be construed as falling within the scope of the present disclosure.

Figure 8:
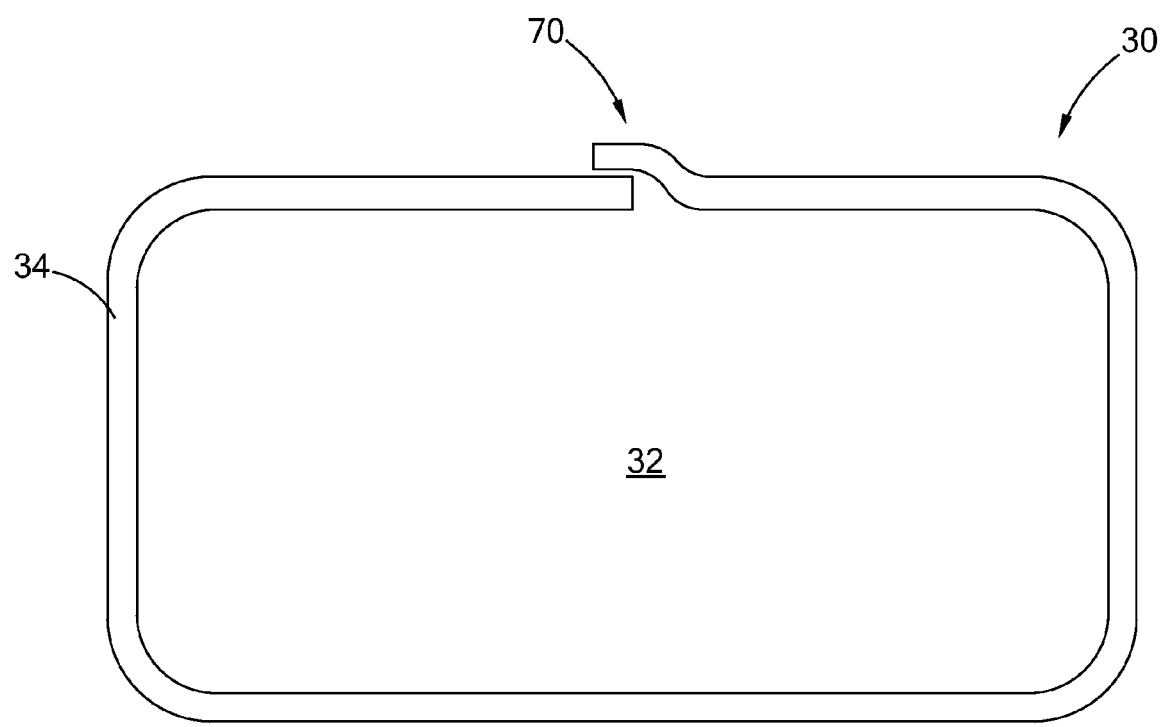
FIG. 8 is an end view of a heat conducting member constructed in accordance with the principles of the present disclosure.

As shown more clearly in FIG. 8, the outer shells 34 of the heat conducting members 30 are wrapped completely around the cores 32. In one form, the outer shells 34 extend around the cores 32 to define an overlap region 70. Accordingly, one end of the outer shell 34 extends over, or overlaps, the other end of the outer shell 34 in order to completely encase the core 32. It should be understood that the outer shells 34 can be configured to be wrapped completely around the cores 32 in other joint configurations, such as a butt or step-lap joint, while remaining within the scope of the present disclosure. Additionally, in some configurations, it is contemplated that the outer shells 34 may be discontinuous or not wrap completely around the cores 32 while remaining within the scope of the present disclosure.

Figure 9:
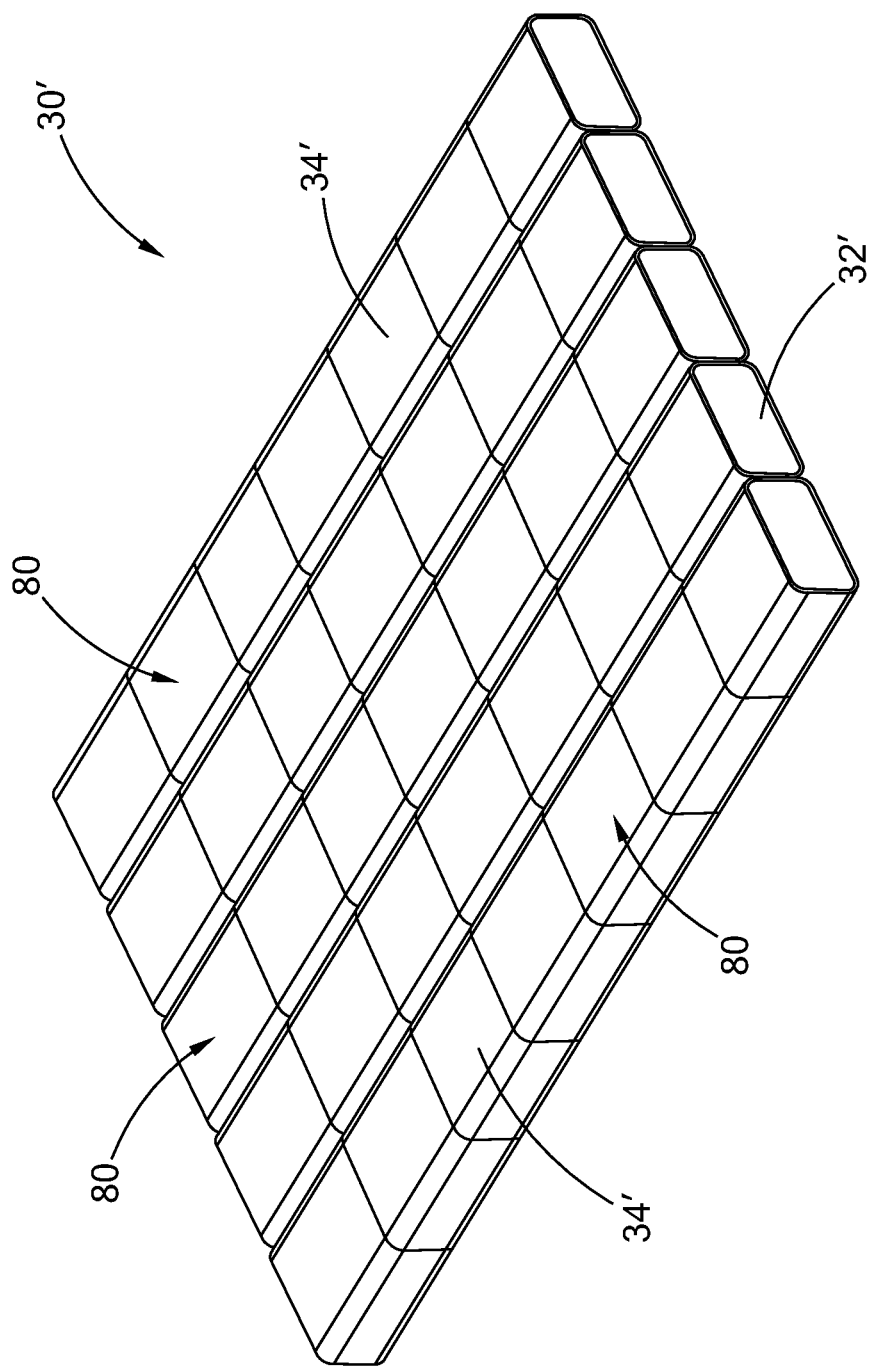
FIG. 9 is a perspective view of an alternate form of the heat conducting members constructed in accordance with the principles of the present disclosure.

Referring now to FIG. 9, another configuration of the heat conducting members is illustrated and generally indicated by reference numeral 30'. In this configuration, the heat conducting members 30' define a grid configuration of individual elements 80, that in one form are in physical contact with one another and that have outer shells 34' that completely encase the cores 32'. It should be understood, however, that other grid configurations having varying geometries for the individual elements 80, and different outer shell configurations as set forth above, shall be construed as falling within the scope of the present disclosure.

Figure 10:
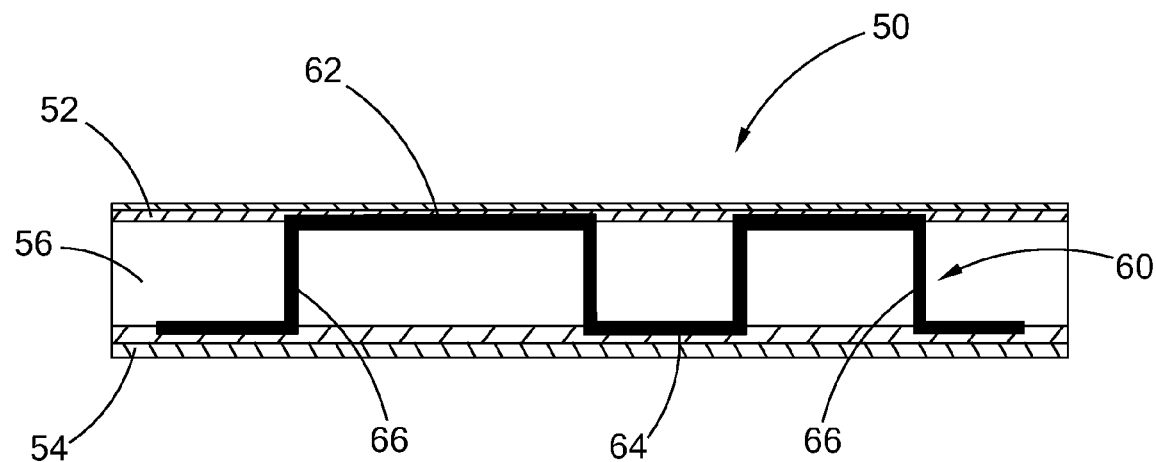
FIG. 10 is an end view of a structural member and heat conducting array constructed in accordance with the principles of the present disclosure.

Referring now to FIG. 10, the structural member 50 and heat conducting array 60 are described in greater detail. As previously set forth, the heat conducting array 60 extends through the foam core 56 and between the upper skin 52 and the lower skin 54 of the structural member. The heat conducting array 60 in one form is a continuous piece, however, it should be understood that the heat conducting array 60 may be discontinuous and/or formed from separate pieces while remaining within the scope of the present disclosure.

The upper skin 52 and lower skin 54 in one form are a Kevlar® material, although it should be understood that other types of fiber-reinforced composites such as carbon-fiber composites or glass-fiber composites may also be employed, in addition to various types of metallic structures. In one form, the foam core 56 comprises a low density, high strength polystyrene foam material, such as Spyderfoam. Additionally, the structural member 50 in this form is an aircraft skin, however, it should be understood that this application is merely exemplary and that other forms of structure such as internal spars or ribs, or structures of other vehicles, buildings, or other devices may be employed while remaining within the scope of the present disclosure.

Figure 11:
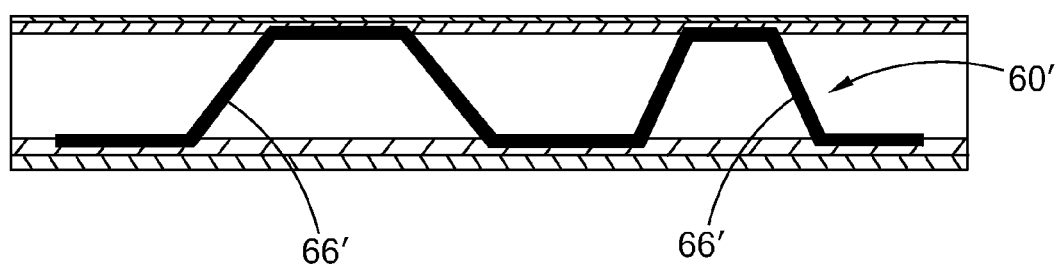
FIG. 11 is an end view of another form of a heat conducting array constructed in accordance with the principles of the present disclosure.

As shown, the wall portions 66 of the heat conducting array 60 extend vertically between the upper caps 62 and the lower caps 64 in one form of the present disclosure. It should be understood, however, that the wall portions 66' may extend at an angle as shown in FIG. 11, creating what is commonly referred to as a "hat" configuration for the heat conducting array 60'. Other variations, including but not limited to "J," "L," or "T" configurations may also be employed according to the heat conducting and structural load requirements of a particular application. Accordingly, it should be understood that a variety of forms of heat conducting arrays 60 may be employed while remaining within the scope of the present disclosure.

Figure 12:
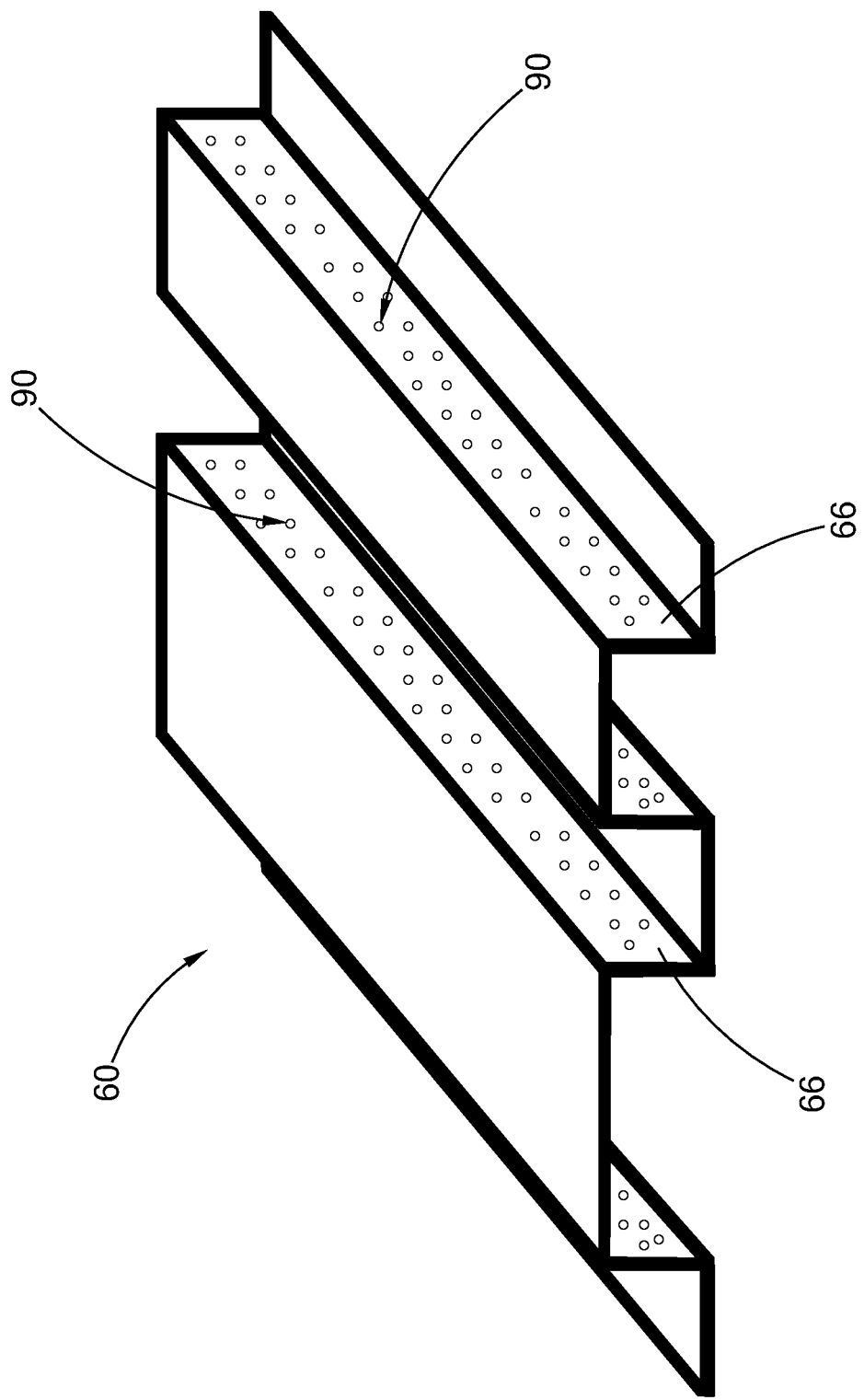
FIG. 12 is a perspective view of a heat conducting array that extends through the structural member and constructed in accordance with the principles of the present disclosure.

Advantageously, as shown in FIG. 12, the wall portions 66 define a plurality of apertures 90, which create openings that allow material of the foam core 56 to migrate through during manufacturing. These apertures 90 provide for improved structural integrity by enhancing the bond between the wall portions 66 and the foam core 56. The manufacture of the structural member 50, and more specifically the heat conducting array 60 and apertures 90, is now described in greater detail.

Figure 13:
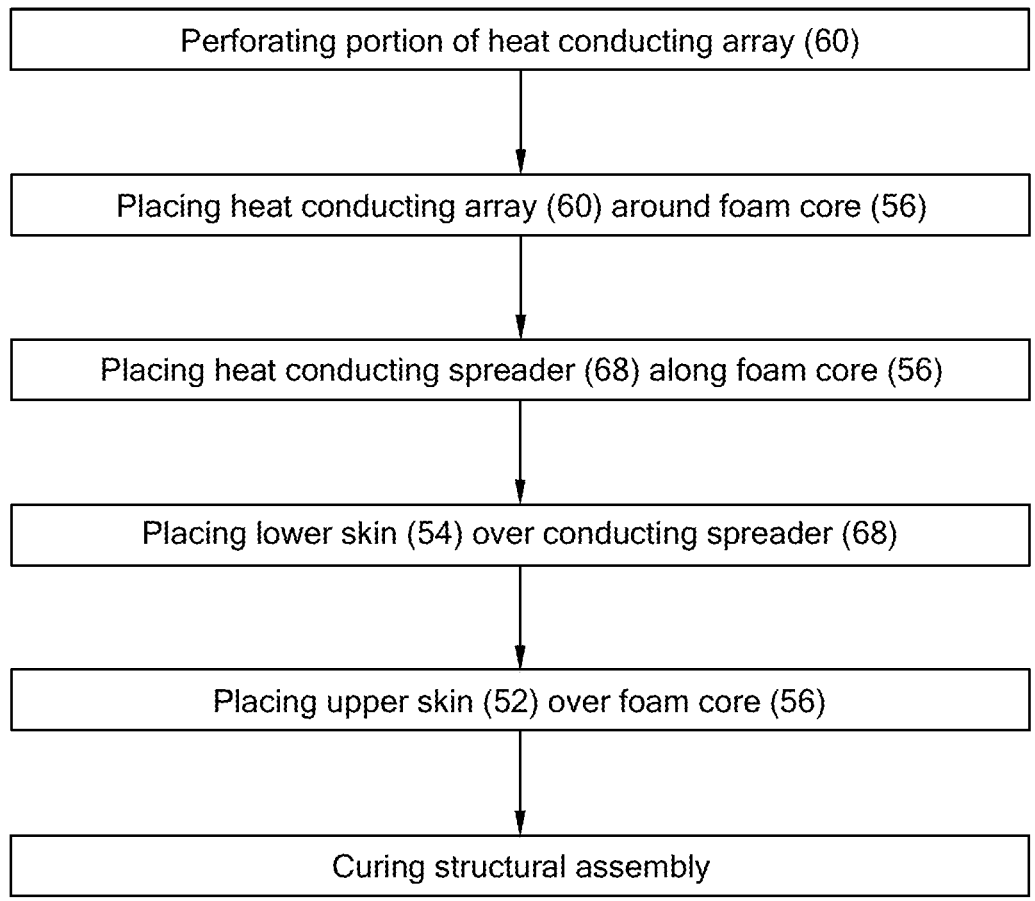
FIG. 13 is a flow diagram illustrating a manufacturing process in accordance with the principles of the present disclosure.

Referring to FIG. 13, the heat conducting array 60 is prepared by perforating at least a portion of the heat conducting array 60, such as the wall portions 66. The heat conducting array 60 is then wrapped around the core elements 32, and the heat conducting spreader 68 is placed along one surface area of the core elements 32. The lower skin 54 is placed over the heat conducting spreader 68, and the upper skin 52 is placed over an opposite surface area of the core elements 32 to create a structural assembly. The structural assembly is then cured, either through a room temperature and standard atmospheric pressure cure or a vacuum autoclave cure, by way of example, wherein a material of the core elements 32 flows through the perforated portions 90 of the heat conducting array 60 during the curing step. As set forth above, this results in an interface between the heat conducting array 60 and the core elements 32 with improved structural integrity.

It should be understood that the order of these manufacturing steps are merely exemplary and that other orders of the steps may be employed, such as placing the upper skin 52 over the heat conducting spreader 68 and the core elements 56 before the lower skin 54, while remaining within the scope of the present disclosure. Additionally, it should be understood that the heat conducting spreader 68 is optional and thus the structural assembly can be formed without this member while remaining within the scope of the present disclosure. Furthermore, the structural assembly may be formed in a press, either heated or non-heated, while remaining within the scope of the present disclosure.

It should be noted that the disclosure is not limited to the various forms described and illustrated as examples. A large variety of modifications have been described and more are part of the knowledge of the person skilled in the art. These and further modifications as well as any replacement by technical equivalents may be added to the description and figures, without leaving the scope of the protection of the disclosure and of the present patent.

The invention claimed is:

1. A method of manufacturing a heat transfer system comprising:
   preparing a heat conducting array by perforating at least a portion of the heat conducting array;
   placing the heat conducting array around foam elements;
   placing a heat conducting spreader along one surface area of the foam elements;
   placing a lower skin over the heat conducting spreader;
   placing an upper skin over an opposite surface area of the foam elements to create a structural assembly; and
   curing the structural assembly by a vacuum autoclave,
   wherein a material of the foam elements flows through the perforated portion of the heat conducting array during the curing step.

2. The method according to claim 1, wherein the heat conducting array is a pyrolytic graphite sheet (PGS) material.

3. The method according to claim 1, wherein the heat conducting spreader is a pyrolytic graphite sheet (PGS) material.

4. The method according to claim 1, wherein the heat conducting array defines at least one upper cap, at least one lower cap, and a wall portion extending between at least one upper cap and at least one lower cap when placed around the foam elements, and the wall portion is perforated.

5. The method according to claim 1 further comprising applying a moisture-proof layer over the upper skin.

6. The method according to claim 5, wherein the moisture-proof layer is an ethylene-co-methacrylic acid (EMAA) material.

7. A method of manufacturing a heat transfer system comprising:
   preparing a heat conducting array by perforating at least a portion of the heat conducting array, the heat conducting array comprising a pyrolytic graphite sheet (PGS) material;
   placing the heat conducting array around foam elements;
   placing a heat conducting spreader along one surface area of the foam elements, the heat conducting spreader comprising a pyrolytic graphite sheet (PGS) material;
   placing a lower skin over the heat conducting spreader;
   placing an upper skin over an opposite surface area of the foam elements to create a structural assembly; and
   curing the structural assembly by a vacuum autoclave,
   wherein a material of the foam elements flows through the perforated portion of the heat conducting array during the curing step.

8. The method according to claim 7, wherein the heat conducting array defines at least one upper cap, at least one lower cap, and a wall portion extending between at least one upper cap and at least one lower cap when placed around the foam elements, and the wall portion is perforated.

9. The method according to claim 7 further comprising applying a moisture-proof layer over the upper skin.

10. The method according to claim 9, wherein the moisture-proof layer is an ethylene-co-methacrylic acid (EMAA) material.

11. A method of manufacturing a heat transfer system comprising:
    preparing a heat conducting array by perforating at least a portion of the heat conducting array;
    placing the heat conducting array around foam elements;
    placing a lower skin over one surface area of the foam elements;
    placing an upper skin over an opposite surface area of the foam elements to create a structural assembly; and
    forming the structural assembly under heat and pressure,
    wherein a material of the foam elements extends through the perforated portion of the heat conducting array during the forming step.

12. The method according to claim 11, wherein the heat conducting array is a pyrolytic graphite sheet (PGS) material.

13. The method according to claim 11 further comprising placing a heat conducting spreader between the lower skin and the core elements.

14. The method according to claim 13, wherein the heat conducting spreader is a pyrolytic graphite sheet (PGS) material.

15. The method according to claim 11, wherein the heat conducting array defines at least one upper cap, at least one lower cap, and a wall portion extending between at least one upper cap and at least one lower cap when placed around the core elements, and the wall portion is perforated.

16. The method according to claim 11, wherein the structural assembly is cured in a vacuum autoclave.

17. The method according to claim 11, wherein the structural assembly is formed in a press.

\* \* \* \* \*